United States Patent
Bowler et al.

(10) Patent No.: US 12,316,581 B2
(45) Date of Patent: *May 27, 2025

(54) FULL DUPLEX EXPANDER IN A FULL DUPLEX NETWORK

(71) Applicant: ARRIS Enterprises LLC, Horsham, PA (US)

(72) Inventors: David B. Bowler, Stow, MA (US); Clarke V. Greene, Middletown, CT (US); Ayham Al-Banna, Irving, TX (US)

(73) Assignee: ARRIS Enterprises LLC, Horsham, PA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/421,466

(22) Filed: Jan. 24, 2024

(65) Prior Publication Data

US 2024/0163069 A1    May 16, 2024

Related U.S. Application Data

(63) Continuation of application No. 18/119,728, filed on Mar. 9, 2023, now Pat. No. 11,916,850, which is a
(Continued)

(51) Int. Cl.
*H04L 5/14* (2006.01)
*H03F 3/62* (2006.01)
(Continued)

(52) U.S. Cl.
CPC ............... *H04L 5/14* (2013.01); *H03F 3/62* (2013.01); *H04B 1/54* (2013.01); *H04B 3/36* (2013.01);
(Continued)

(58) Field of Classification Search
CPC ... H04B 1/48; H04B 1/54; H04B 3/32; H04B 3/36; H03F 3/62; H04L 5/14;
(Continued)

(56) References Cited

U.S. PATENT DOCUMENTS 5,999,564 A    12/1999    Dagdeviren
6,031,868 A    2/2000    Robertson et al.
(Continued)

FOREIGN PATENT DOCUMENTS

CN    106233635 A    12/2016
CN    107317665 A    11/2017
(Continued)

OTHER PUBLICATIONS

Hamzeh et al., "Data-Over-Cable Service Interface Specifications, DOCSIS 3.1", Oct. 5, 2017, 291 pages, Cable Labs.
(Continued)

*Primary Examiner* — Eric Nowlin
(74) *Attorney, Agent, or Firm* — Chernoff, Vilhauer, McClung & Stenzel, LLP

(57) ABSTRACT

In one embodiment, a method receives a downstream signal and an upstream signal in a same frequency band. The downstream signal and the upstream signal are separated into a first path and a second path. The downstream signal using the first path and the upstream signal using the second path are amplified in an analog domain. The method isolates the downstream signal and the upstream signal from one another and sends the downstream signal downstream to a subscriber device and sends the upstream signal towards a full duplex node.

14 Claims, 6 Drawing Sheets

Related U.S. Application Data continuation of application No. 17/171,293, filed on Feb. 9, 2021, now Pat. No. 11,616,632, which is a continuation of application No. 15/845,054, filed on Dec. 18, 2017, now Pat. No. 10,924,253.

(51) Int. Cl.
| | |
|---|---|
| *H04B 1/48* | (2006.01) |
| *H04B 1/54* | (2006.01) |
| *H04B 3/32* | (2006.01) |
| *H04B 3/36* | (2006.01) |
| *H04L 12/28* | (2006.01) |

(52) U.S. Cl.
CPC ............ *H04L 12/2801* (2013.01); *H04B 1/48* (2013.01); *H04B 3/32* (2013.01)

(58) Field of Classification Search
CPC ............ H04L 12/2801; H04L 12/4633; H04L 12/4641; H04L 45/586; H04L 45/74; H04L 47/18; H04L 49/252; H04L 69/22; H04W 72/042; H04W 72/1289
See application file for complete search history.

(56) References Cited

U.S. PATENT DOCUMENTS

| | | | |
|---|---|---|---|
| 6,292,559 | B1 | 9/2001 | Gaikwad et al. |
| 6,317,495 | B1 | 11/2001 | Gaikwad et al. |
| 6,421,728 | B1 | 6/2002 | Mohammed et al. |
| 6,490,727 | B1 | 12/2002 | Nazarathy et al. |
| 6,751,271 | B2 | 6/2004 | Kien et al. |
| 6,839,429 | B1 | 1/2005 | Gaikwad et al. |
| 7,006,610 | B2 | 2/2006 | Schoessow |
| 7,031,379 | B2 | 4/2006 | Sestok et al. |
| 7,623,532 | B2 | 11/2009 | Livia et al. |
| 7,706,744 | B2 | 4/2010 | Rodgers et al. |
| 8,325,631 | B2 | 12/2012 | Cotton et al. |
| 8,693,342 | B2 | 4/2014 | Uyehara et al. |
| 8,761,294 | B2 | 6/2014 | Nuzman et al. |
| 8,817,903 | B2 | 8/2014 | Nuzman |
| 8,818,299 | B2 | 8/2014 | Morrison et al. |
| 9,042,840 | B2 | 5/2015 | Khandekar et al. |
| 9,219,520 | B2 | 12/2015 | Uyehara et al. |
| 9,859,946 | B2 | 1/2018 | Morrison et al. |
| 9,942,024 | B2 | 4/2018 | Jin et al. |
| 9,954,631 | B2 | 4/2018 | Kerpez et al. |
| 10,117,234 | B2 | 10/2018 | Stanwood et al. |
| 10,243,681 | B2 * | 3/2019 | Goichberg .......... H04L 12/2898 |
| 10,361,748 | B2 | 7/2019 | Zhang et al. |
| 10,425,215 | B2 | 9/2019 | Lee et al. |
| 10,454,662 | B2 * | 10/2019 | Lakhani ................ H04L 5/1461 |
| 10,491,249 | B2 | 11/2019 | Hewavithana et al. |
| 10,608,700 | B2 | 3/2020 | Krapp et al. |
| 10,615,875 | B2 * | 4/2020 | Mutalik ........... H04B 10/25751 |
| 10,892,829 | B1 | 1/2021 | Jia et al. |
| 10,917,175 | B2 * | 2/2021 | Jia ...................... H04B 10/2589 |
| 10,924,253 | B2 | 2/2021 | Bowler et al. |
| 10,938,444 | B2 | 3/2021 | Kliger et al. |
| 10,950,956 | B2 | 3/2021 | Krapp et al. |
| 10,958,347 | B2 * | 3/2021 | Mutalik .......... H04B 10/25751 |
| 10,992,446 | B2 | 4/2021 | Bowler et al. |
| 11,057,006 | B2 | 6/2021 | Williams et al. |
| 11,057,137 | B2 | 6/2021 | Kerpez et al. |
| 11,070,292 | B2 * | 7/2021 | Mutalik .............. H04L 12/2856 |
| 11,082,143 | B2 * | 8/2021 | Jia ...................... H04B 10/2589 |
| 11,133,915 | B2 * | 9/2021 | Kol ..................... H04L 5/1469 |
| 11,146,310 | B2 | 10/2021 | Strobel et al. |
| 11,245,472 | B1 | 2/2022 | Jia et al. |
| 11,329,407 | B2 | 5/2022 | Krapp et al. |
| 11,569,973 | B1 | 1/2023 | Hamzeh et al. |
| 11,616,632 | B2 | 3/2023 | Bowler et al. |
| 11,716,164 | B1 * | 8/2023 | Jia ...................... H04B 10/2589 |
| | | | 370/278 |
| 11,916,850 | B2 * | 2/2024 | Bowler ................ H04B 1/54 |
| 2002/0062380 | A1 | 5/2002 | Mohammed et al. |
| 2003/0007632 | A1 | 1/2003 | Schoessow |
| 2003/0043894 | A1 | 3/2003 | Sestok et al. |
| 2005/0272367 | A1 | 12/2005 | Rodgers et al. |
| 2009/0067451 | A1 | 3/2009 | Cotton et al. |
| 2009/0252069 | A1 | 10/2009 | Ahn et al. |
| 2011/0103274 | A1 | 5/2011 | Vavik |
| 2012/0076119 | A1 | 3/2012 | Li |
| 2012/0309328 | A1 | 12/2012 | Morrison et al. |
| 2013/0107763 | A1 | 5/2013 | Uyehara et al. |
| 2013/0163525 | A1 | 6/2013 | Moon et al. |
| 2013/0215935 | A1 | 8/2013 | Nuzman et al. |
| 2013/0215951 | A1 | 8/2013 | Nuzman |
| 2013/0329673 | A1 | 12/2013 | Kwon et al. |
| 2014/0219140 | A1 | 8/2014 | Uyehara et al. |
| 2015/0215059 | A1 | 7/2015 | Kerpez et al. |
| 2015/0229461 | A1 | 8/2015 | DiFazio et al. |
| 2015/0270942 | A1 | 9/2015 | Sorbara et al. |
| 2015/0288414 | A1 | 10/2015 | Morrison et al. |
| 2015/0327273 | A1 | 11/2015 | Larsson et al. |
| 2017/0019146 | A1 | 1/2017 | Jin et al. |
| 2017/0019241 | A1 | 1/2017 | Jin et al. |
| 2017/0207902 | A1 | 7/2017 | Lakhani et al. |
| 2017/0237491 | A1 | 8/2017 | Mutalik et al. |
| 2017/0237492 | A1 | 8/2017 | Mutalik et al. |
| 2017/0244445 | A1 | 8/2017 | Jin et al. |
| 2018/0159588 | A1 | 6/2018 | Williams et al. |
| 2018/0205533 | A1 | 7/2018 | Lee et al. |
| 2018/0219640 | A1 | 8/2018 | Kerpez et al. |
| 2018/0234275 | A1 | 8/2018 | Miller et al. |
| 2018/0351268 | A1 | 12/2018 | Krapp et al. |
| 2019/0028145 | A1 | 1/2019 | Sun et al. |
| 2019/0044555 | A1 | 2/2019 | Hewavithana et al. |
| 2019/0058540 | A1 * | 2/2019 | Goichberg ............ H04J 3/0682 |
| 2019/0081661 | A1 | 3/2019 | Krapp et al. |
| 2019/0190684 | A1 | 6/2019 | Bowler et al. |
| 2019/0386776 | A1 | 12/2019 | Lefevre et al. |
| 2019/0393927 | A1 | 12/2019 | Strobel et al. |
| 2020/0044765 | A1 | 2/2020 | Jia et al. |
| 2020/0076508 | A1 | 3/2020 | Jia et al. |
| 2020/0162230 | A1 | 5/2020 | Kol et al. |
| 2020/0213008 | A1 * | 7/2020 | Mutalik .................... H04L 5/14 |
| 2020/0366007 | A1 | 11/2020 | Krapp et al. |
| 2021/0013924 | A1 | 1/2021 | Kliger et al. |
| 2021/0135707 | A1 | 5/2021 | Tsiaflakis et al. |
| 2021/0167857 | A1 * | 6/2021 | Jia ............................. H04L 5/14 |
| 2021/0167936 | A1 | 6/2021 | Bowler et al. |
| 2021/0273725 | A1 * | 9/2021 | Mutalik .............. H04L 12/2885 |
| 2022/0069969 | A1 | 3/2022 | Young et al. |
| 2022/0239426 | A1 | 7/2022 | Trojer et al. |
| 2023/0216651 | A1 * | 7/2023 | Bowler ................ H04L 12/2801 |
| | | | 370/276 |

FOREIGN PATENT DOCUMENTS

| | | | | |
|---|---|---|---|---|
| CN | 108604883 | A * | 9/2018 | ............ H03F 1/3247 |
| CN | 105991259 | B | 5/2019 | |
| EP | 3288182 | A1 * | 2/2018 | ............ H03F 1/3241 |
| EP | 3349364 | A1 | 7/2018 | |
| EP | 3349364 | B1 * | 9/2019 | ................ H04B 3/21 |
| EP | 3654539 | A1 * | 5/2020 | ................ H04B 3/20 |
| WO | 2011075037 | A1 | 6/2011 | |
| WO | WO-2015077876 | A1 * | 6/2015 | ............. H04B 1/525 |
| WO | 2016120726 | A1 | 8/2016 | |
| WO | WO-2017139781 | A1 * | 8/2017 | ........ H04B 10/25751 |
| WO | WO-2018093793 | A1 * | 5/2018 | ............ H03F 1/3247 |
| WO | WO-2018130224 | A1 * | 7/2018 | ................ H04B 3/20 |

OTHER PUBLICATIONS

PCT International Search Report & Written Opinion, RE: Application No. PCT/US2018/066218, Mar. 22, 2019.

Chinese Office Action Re: Application No. 201880087394.5 dated May 8, 2021.

Jin et al., Echo cancellation techniques for supporting full duplex DOCSIS, 2017, Proceedings Society of Cable Telecommunications Engineers (SCTE) 2017, pp. 1-24 (Year: 2017).

(56) References Cited

OTHER PUBLICATIONS

Gowdal et al., Full-duplex DOCSIS: A Modem Architecture for Wideband (>1GHZ) Self-interference Cancellation for Cable Modem Termination Systems (CMTS), 2018, 2018 52nd Asilomar Conference on Signals, Systems, and Computers, pp. 2202-2206, doi: 10.1109/ACSSC.2018.8645538 (Year: 2018).

Xu et al., Efficient Echo-Cancellation Algorithms for Full Duplex Coherent Optical Systems, 2020, 2020 Optical Fiber Communications Conference and Exhibition (OFC), pp. 1-3 (Year: 2020).

Berscheid et al., Full Duplex DOCSIS: Opportunities and Challenges, Aug. 2019, IEEE Communications Magazine, vol. 57, No. 8, pp. 28-33, DOI: 10.1109/MCOM.2019.1800851 (Year: 2019).

Chinese Office Action Re: Application No. 201880087394.5 dated Mar. 3, 2022.

\* cited by examiner

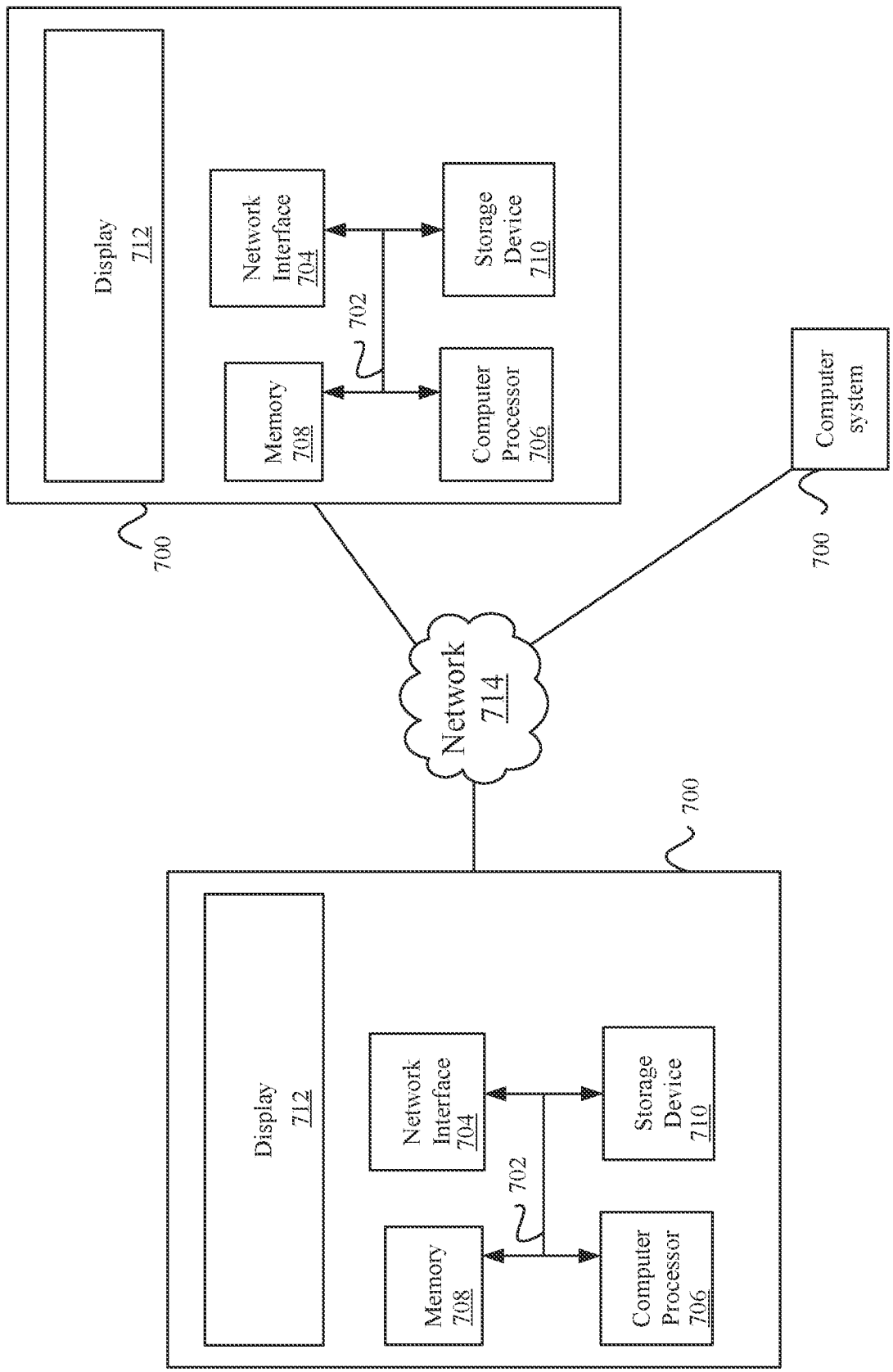

FULL DUPLEX EXPANDER IN A FULL DUPLEX NETWORK

CROSS-REFERENCE TO RELATED APPLICATIONS

The present application is a continuation of U.S. patent application Ser. No. 18/119,728 filed Mar. 9, 2023, which is a continuation of U.S. patent application Ser. No. 17/171,293 filed Feb. 9, 2021, now U.S. Pat. No. 11,616,632, which is a continuation of Ser. No. 15/845,054 filed Dec. 18, 2017, now U.S. Pat. No. 10,924,253 the contents of which are each incorporated herein by reference in their entirety.

BACKGROUND

Full duplex communications, such as full duplex (FDX) Data Over Cable Service Interface Specification (DOCSIS), is a data delivery system where both the downstream and the upstream traffic is delivered in the same frequency band. For example, the downstream traffic may be delivered from a head end to FDX nodes, which then deliver the traffic to subscriber devices located downstream. The upstream traffic is delivered from subscriber devices through FDX nodes to the head end in the same frequency band as the downstream traffic.

To deliver the full-duplex traffic, the network is converted to an N+0 architecture, which means that the amplifiers in the network are removed and replaced with FDX nodes. The amplifiers are replaced because FDX transmission is not compatible with the legacy analog amplifiers. For example, legacy analog amplifiers use diplex filters to provide isolation between the upstream amplification path and the downstream amplification path. The diplex filters prevent the amplifier from oscillating, but using the diplex filters only works because the upstream and downstream communications occur in different frequency bands. Thus, when upstream and downstream traffic is delivered in the same frequency band, the legacy analog amplifiers cannot be used.

Converting the amplifiers to FDX nodes to use an N+0 architecture may significantly increase the cost and timeline required to roll out the network to use full duplex transmission. The cost increases because the FDX nodes use fiber connections from the head end to the nodes and the amplifiers that are being replaced connected via coaxial cable and not connected via fiber. A provider needs to replace the coaxial cable with fiber when the FDX node replaces the legacy analog amplifiers, which not only increases the cost, but replacing the coaxial cable with fiber takes time.

BRIEF DESCRIPTION OF THE DRAWINGS

FIG. 7 illustrates an example of a special purpose computer systems configured with a FDX expander according to one embodiment.

DETAILED DESCRIPTION

Described herein are techniques for a full duplex communication system. In the following description, for purposes of explanation, numerous examples and specific details are set forth in order to provide a thorough understanding of some embodiments. Some embodiments as defined by the claims may include some or all of the features in these examples alone or in combination with other features described below, and may further include modifications and equivalents of the features and concepts described herein.

Some embodiments provide a full duplex (FDX) expander that is used to amplify full duplex signals. The full duplex signals transmit both upstream and downstream traffic in the same frequency band. The FDX expanders can be used in place of analog amplification in the full duplex network. The FDX expanders can receive a downstream signal and an upstream signal in the same frequency band where the downstream signal is received from a full duplex (FDX) node and the upstream signal originated from a subscriber device. The FDX expander then separates the downstream signal and the upstream signal into separate paths. The downstream signal is amplified using a first path and the upstream signal is amplified using a second path. In some embodiments, the FDX expander isolates the downstream signal and the upstream signal. Different methods for isolating the downstream signal and the upstream signal from one another are appreciated and will be described in more detail below. After amplification, the FDX expander sends the downstream signal downstream toward a subscriber device and sends the upstream signal towards the FDX node. The FDX expander allows amplification to be performed in the full duplex network without having to replace the amplifier with a FDX node. For example, the analog connection, such as via a coaxial cable connection, to the FDX expander from the FDX node can be maintained in the full duplex system while continuing to provide amplification.

System Overview

Figure 1:
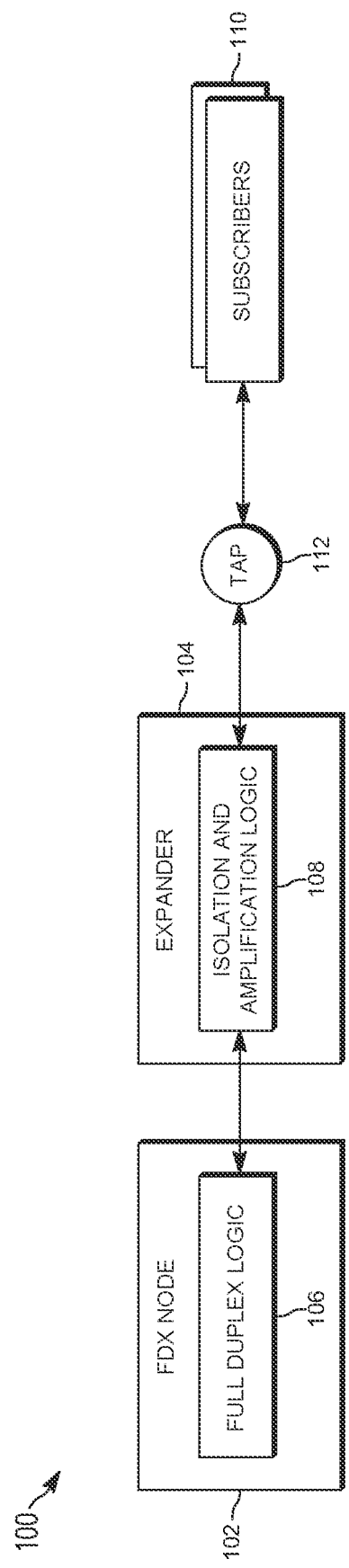
FIG. 1 depicts a simplified system for amplifying full duplex signals according to some embodiments.

FIG. 1 depicts a simplified system 100 of a method for amplifying full duplex signals according to some embodiments. System 100 includes a FDX node 102, an expander 104, and subscribers 110. It will be understood that other components of the network may be included, such as other FDX nodes 102 and expanders 104 may be included. Further, although not shown, a head end may be located upstream of FDX node 102. In some embodiments, FDX node 102 may be part of a remote physical (PHY) device that can be located closer to the subscriber's premises, such as in a node located in the neighborhood where the subscribers are located. The relocated physical device is referred to as a remote physical device (RPD). FDX node 102 converts packets on a digital interface, such as an Ethernet interface received via a digital network, such as via optical fiber, to analog signals, such as radio frequency (RF) signals, on a hybrid fiber coaxial (HFC) network. FDX node 102 sends the RF signals to modems located at a subscriber's premises via an analog network, such as via coaxial cable.

Full duplex signals may include different types of traffic, such as data and video. In the downstream direction, signals from the head end are sent through FDX node 102 toward subscribers 110 through expander 104. A group of subscribers may be connected to a tap 112 that provides connections to subscribers 110. Subscribers 110 may include subscriber devices, such as modems that receive the downstream signals and send the upstream signals. In some embodiments, the modems include cable modems, but other devices may be appreciated, such as gateways. In the upstream direction, subscribers 110 send upstream signals toward the head end through expander 104 and FDX node 102.

In the downstream direction, FDX node 102 may receive a downstream signal from the headend and process the downstream signal using full duplex logic 106. As discussed above, FDX node 102 may receive packets via a digital network. Then, FDX node 102 sends the downstream signal to expander 104. The downstream signal is sent via an analog network. Expander 104 then amplifies the downstream signal in the analog domain. Also, in the upstream direction, expander 104 receives upstream signals and can amplify the upstream signals in the analog domain. Then, expander 104 sends the upstream signals towards the head end, which eventually reach FDX node 102. The upstream signals are sent via the analog network.

Expander 104 receives the downstream and the upstream signals in the same frequency band, which may be a range of frequencies that includes both the downstream and the upstream signals. In some embodiments, the downstream and upstream signals are sent at the same time, but in other embodiments may be sent at different times. Expander 104 may process the downstream and upstream signals using isolation and amplification logic 108, which may separate the downstream and upstream signals that are sent in the same frequency band. Isolation and amplification logic 108 then can amplify the downstream signal using a first path and the upstream signal using a second path. The amplification is performed in the analog domain while isolating the downstream signal and the upstream signal from one another. After amplification, expander 104 may send the downstream signals toward subscribers 110 and send the upstream signals toward a head end.

In some embodiments, FDX expanders 104 may replace legacy analog amplifiers in the network. The use of FDX expanders 104 allows full duplex traffic to be sent in the network without having to replace the legacy analog amplifiers with FDX nodes 102. Also, the connection between FDX node 102 and FDX expanders 104 may be transmit analog signals, such as radio frequency (RF) signals, that may be communicated over a coaxial cable instead of fiber. This means that the signals in the downstream direction from FDX node 102 to FDX expanders 104 may be in the analog domain. If fiber was used, then the communications from FDX node 102 to another FDX node may be in the digital domain, which would require the coaxial cable to be replaced between two FDX nodes 102 as described in the Background.

Figure 2:
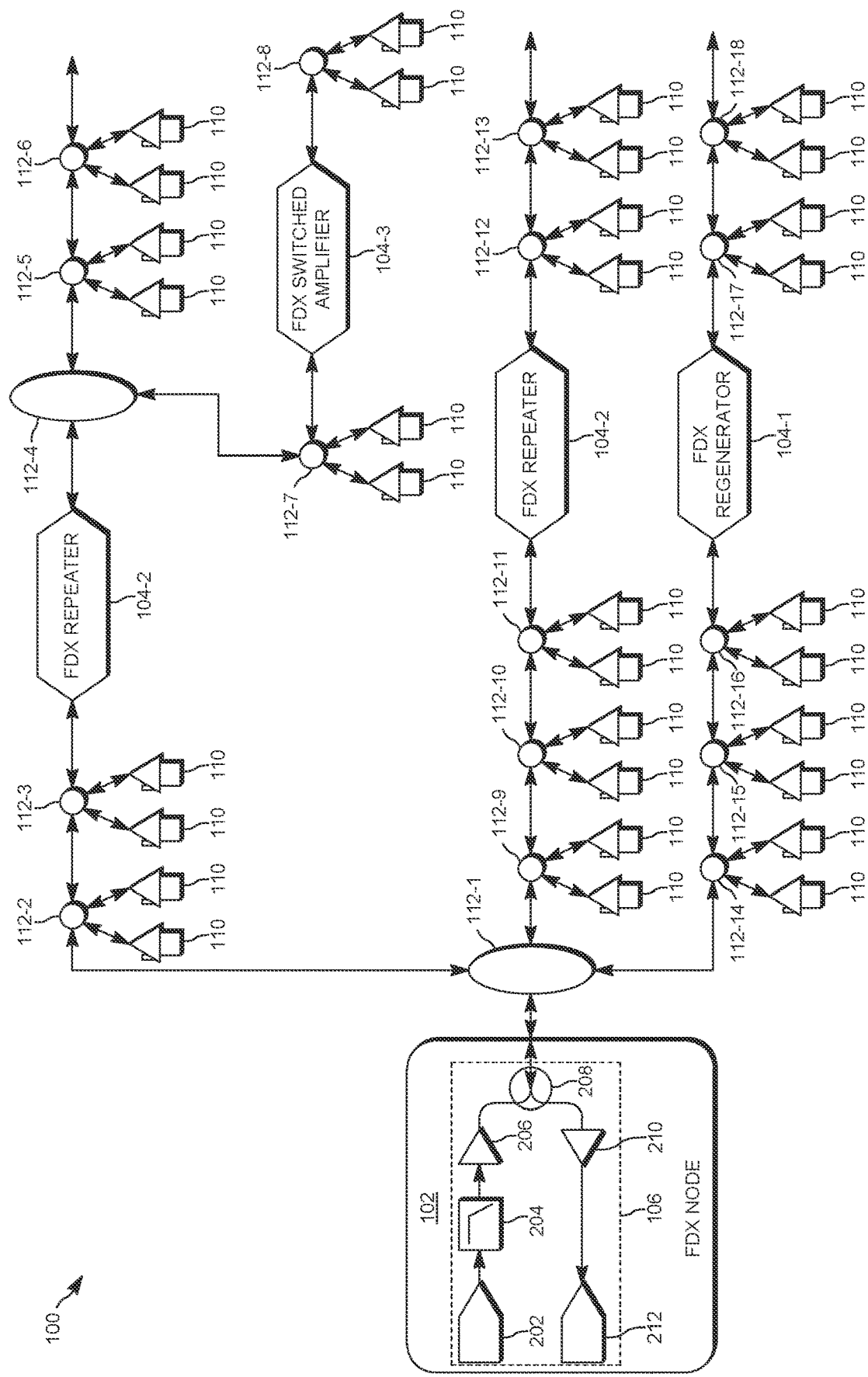
FIG. 2 depicts a more detailed example of the system according to some embodiments.

FIG. 2 depicts a more detailed example of system 100 according to some embodiments. In the network, various taps 112-1 to 112-18 are included that couple signals to subscribers 110. Additionally, different types of FDX expanders 104 may be included in various positions to provide amplification in the network at different points.

FDX node 102 uses full duplex logic 106 to convert digital signals to analog signals in the downstream direction and convert analog signals to digital in the upstream direction. In the downstream direction, full duplex logic 106 in FDX node 102 may include a digital-to-analog converter (DAC) that converts the digital signal to analog. An anti-aliasing filter 204 may attenuate the higher frequencies to prevent aliasing components from being sampled. Then, an amplifier 206 amplifies the signal. A directional coupler 208 couples the analog downstream signal to tap 112-1.

In the upstream direction, directional coupler 208 receives the analog upstream signal and couples the signal to amplifier 210, which amplifies the upstream signal. Then, an analog-to-digital converter 212 converts the analog signal to digital. The digital upstream signal can then be sent toward the head end. Although this full duplex logic is described, it will be understood that other variations of the full duplex circuitry may be appreciated.

In some embodiments, expander 104 may be implemented using three different types of expanders, such as a FDX regenerator 104-1, a FDX repeater 104-2, and/or a FDX switched amplifier 104-3. Although this configuration of expanders 104 is described, it will be understood that FDX regenerator 104-1, FDX repeater 104-2, and FDX switched amplifier 104-3 may be placed in different positions in the network and other implementations will be appreciated. For example, all three implementations do not need to be implemented in a network, such as only one or two of the implementations may be used.

In one path, FDX node 102 may be coupled to FDX repeater 104-2, which is then coupled to FDX switched amplifier 104-3. A second path couples FDX node 102 to FDX repeater 104-2 and a third path couples FDX node 102 to FDX regenerator 104-1. FDX repeater 104-2 and FDX regenerator 104-1 may further be coupled to other FDX repeaters or regenerators or switched amplifiers further downstream in the network.

FDX expanders 104 may be located at N+1, N+2, etc. positions in the network. For example, FDX repeater 104-2 may be located at the N+1 position of a network and FDX switched amplifier 104-3 may be located at the N+2 position. The N+X notation, which X is a number, means that FDX repeater 104-2 is performing a first level of amplification from FDX node 102 and FDX switched amplifier 104-3 is performing a second level of amplification from FDX node 102. The number X is the number of nodes in which the signal is amplified.

FDX regenerator 104-1, FDX repeater 104-2, and FDX switched amplifier 104-3 provide amplification of downstream and upstream signals while providing isolation. FDX regenerator 104-1 and FDX repeater 104-2 can isolate the downstream and upstream signals and amplify the downstream and upstream signals at the same time. However, FDX switched amplifier 104-3 may amplify downstream and upstream signals that are sent in a time divisional duplex (TDD) manner That is, at one time, subscribers 110 may be in a transmit or receive mode. In contrast, it is possible for FDX regenerator 104-1 and FDX repeater 104-2 to process signals while subscribers were in both transmit and receive modes at the same time. For example, a first subscriber may be receiving a downstream transmission and a second subscriber may be sending an upstream transmission during a same time period. The downstream and upstream transmissions are processed by FDX regenerator 104-1 or FDX repeater 104-2 during the same time period.

In the network, interference groups result when a modem in the network is transmitting, other modems see that transmission and perceive the transmission as noise interference. The magnitude of the interference varies based on the transmit power of the modem and the isolation between each modem pair. For some modem pairs, this interference level will severely limit the downstream receive signal-to-noise ratio (SNR) of the victim modem (e.g., the modem receiving the interference). In this case, the modem pairs will be assigned to a same interference group and will not be allowed to transmit and receive simultaneously. Since a single modem may limit the receive SNR of many modems, all of these modems are assigned to the same interference group. Typically, these interference groups are located near each other and have relatively few isolating network elements. In this example where the modems in the interference group are limited to transmitting at different times, FDX switched amplifier 104-3 may be used without losing any of the full duplex functionality of the network. That is, FDX switched amplifier 104-3 may never process full duplex traffic at the same time and thus can be used without any negative limitations on full duplex traffic being received and sent in the upstream and downstream directions at the same time.

In some examples, the analysis of the network may be used to determine which type of FDX expander is used. For example, FDX regenerators 104-1 may be used in positions in the network that are coupled to a large number of subscribers 110. Also, FDX switched amplifiers 104-3 may be used when coupled to a small number of subscribers 110 that are limited to TDD communications.

The following will now describe the different types of FDX expanders 104 in more detail.

FDX Regenerator 104-1

Figure 3:
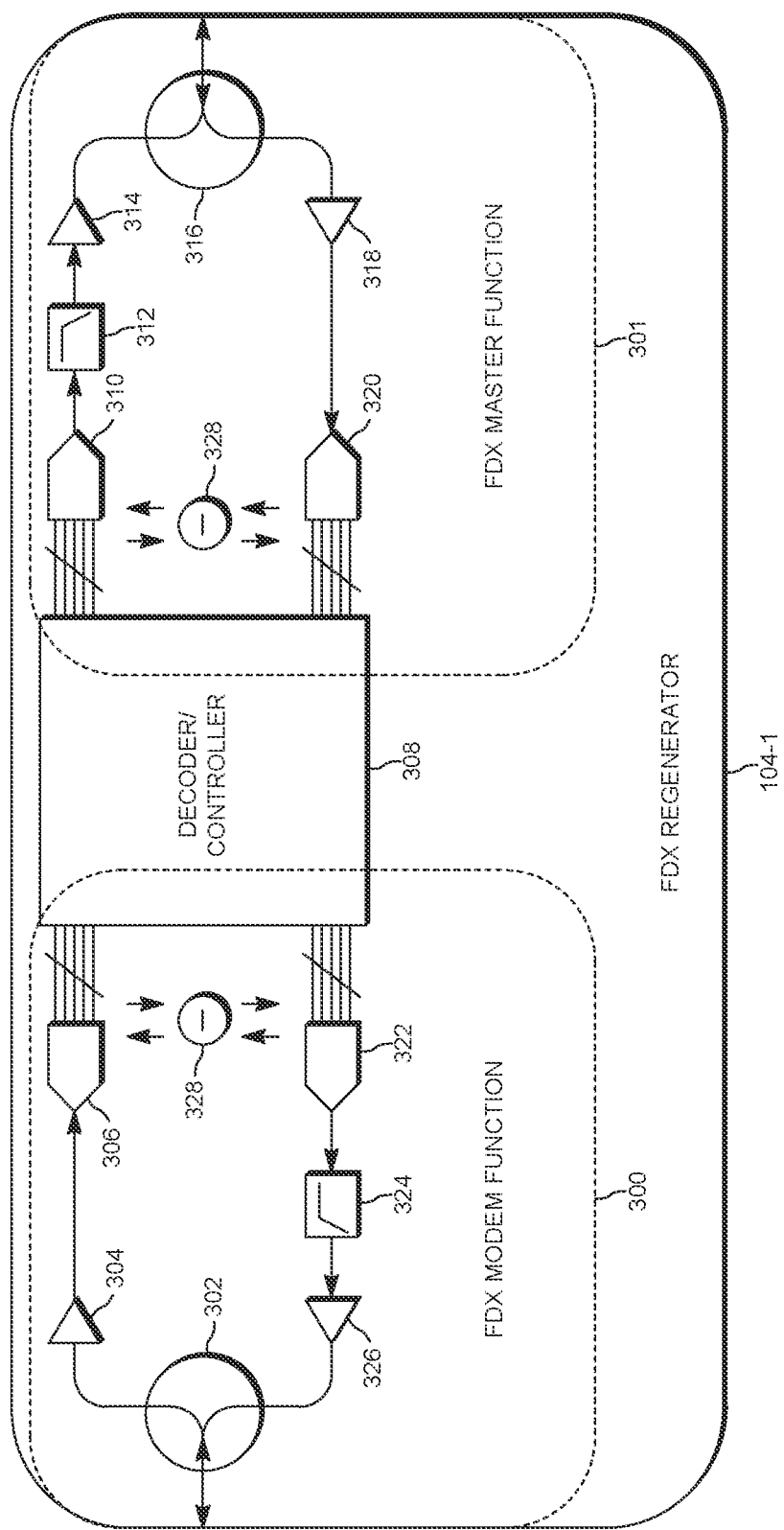
FIG. 3 depicts an example of a FDX regenerator according to some embodiments.

FIG. 3 depicts an example of FDX regenerator 104-1 according to some embodiments. Although this configuration of FDX regenerator 104 is described, it will be understood that variations of the logic described may be appreciated. In FDX regenerator 104-1, the upstream and downstream paths may contain the same functional elements.

FDX regenerator 104-1 includes two interfaces referred to as a FDX modem function 300 and a FDX master function 301. FDX modem function 300 performs a function that implements a modem. Also, FDX master function 301 may perform a function that is performed by FDX node 102. The use of FDX modem function 300 and FDX master function 301 provides a modem interface on the network side interface of FDX regenerator 104-1 and FDX master function 301 provides an interface similar to what is included in FDX node 102 on the subscriber side interface.

FDX regenerator 104-1 includes a downstream path and an upstream path. In the downstream direction, a directional coupler 302 receives the downstream signal and can couple the downstream signal into the downstream path to an amplifier 304. Amplifier 302 amplifies the signal in the analog domain Amplification will be described as being performed in both FDX modem function 300 and a FDX master function 301, but it will be understood that amplification may only be performed in one of FDX modem function 300 and FDX master function 301. For example, amplification may be performed only in the transmit side, such as in FDX master function 301 in the downstream direction and in FDX modem function 300 in the upstream direction.

After amplification, an analog-to-digital converter 306 converts the analog signal to a digital signal. Then, a decoder/controller 308 may decode the signal, which fully deconstructs the signal and then reconstructs the signal. The deconstruction may generate individual code words for the digital signal. Decoder/controller 308 convert from a codeword that represents the instantaneous power in time of the waveform that is intended to be retransmitted, into the fundamental data content that is encoded within that waveform. There is an analog waveform that is present at the input of ADC 306 that represents the power over time of the composite signal that is being sent through the network.

ADC 306 measures that power at a series of specific time instants and reports a series of codewords that are proportional to the instantaneous power in time samples. Decoder/controller 308 performs the additional step of taking these samples and demodulating them into the baseband signal such that it yields the actual data content of the signal.

Decoder/controller 308 then re-modulated/re-encoded the data and then feeds the data into to a digital-to-analog converter (DAC) 310 as a series of codewords that once again represent the instantaneous power in time as a series of codewords. The DAC 310 receives the codewords and turns the codewords into an analog waveform with a power that matches the codeword values. The analog to digital conversion and the digital to analog conversion is used to isolate the network side interface and the subscriber side interface. That is, the receiver side is isolated from the transmitter side in either the downstream path or the upstream path.

An anti-aliasing filter 312 may then attenuate the higher frequencies to prevent aliasing components from being sampled. An amplifier 314 can then amplify the signal. A directional coupler 316 couples the signal in the downstream direction towards subscribers 110.

In the upstream direction, directional coupler 316 may receive the upstream signal that originated from subscribers 110 and couple the upstream signal to an amplifier 318, which amplifies the signal. An analog-to-digital converter 320 then converts the analog signal to digital. Decoder/controller 308 can then decode the signal and then encode the signal, which deconstructs the signal and reconstructs the signal. A digital-to-analog converter 322 converts the digital signal to analog. An anti-aliasing filter 324 receives the signal and attenuates the higher frequencies. An amplifier 326 can then amplify the signal. Directional coupler 302 can then couple the upstream signal in the upstream direction.

FDX regenerator 104-1 may also isolate the downstream path and the upstream path by cancelling crosstalk. For example, crosstalk cancellation logic 328 may cancel any crosstalk that occurs between the downstream direction and the upstream direction, such as preventing a transmitter of FDX regenerator 104-1 from corrupting the signal present at a receiver of FDX regenerator 104-1. Crosstalk occurs when the downstream signal is being sent downstream through directional coupler 316, but then some amount of the downstream signal is directed in the upstream direction through amplifier 318. Similarly, crosstalk occurs when the upstream signal is being sent upstream through directional coupler 302, but then some amount of the upstream signal is directed in the downstream direction through amplifier 304. Crosstalk logic 328 may cancel the small amount of the downstream signal that is sent in the upstream direction by creating an inverse of the signal to cancel the crosstalk as a function of frequency and phase shift. Also, crosstalk logic 328 similarly cancels the upstream signal that is sent in the downstream direction. Crosstalk logic 328 provides isolation between the downstream signal and the upstream signal.

The crosstalk cancellation may be performed in the digital or analog domain That is, crosstalk logic 328 may perform the crosstalk cancellation after the analog signals are converted to digital signals, or perform the crosstalk cancellation before the analog signals are converted to digital signals. In FDX regenerator 104-1, crosstalk cancellation is performed on both the input and output sides of decoder/controller 308 to prevent the transmitter of FDX regenerator 104-1 from corrupting the signal present at the receiver of FDX regenerator 104-1. The cancellation on both sides is needed because crosstalk may occur on both sides of decoder/controller 308.

FDX Repeater 104-2

Figure 4:
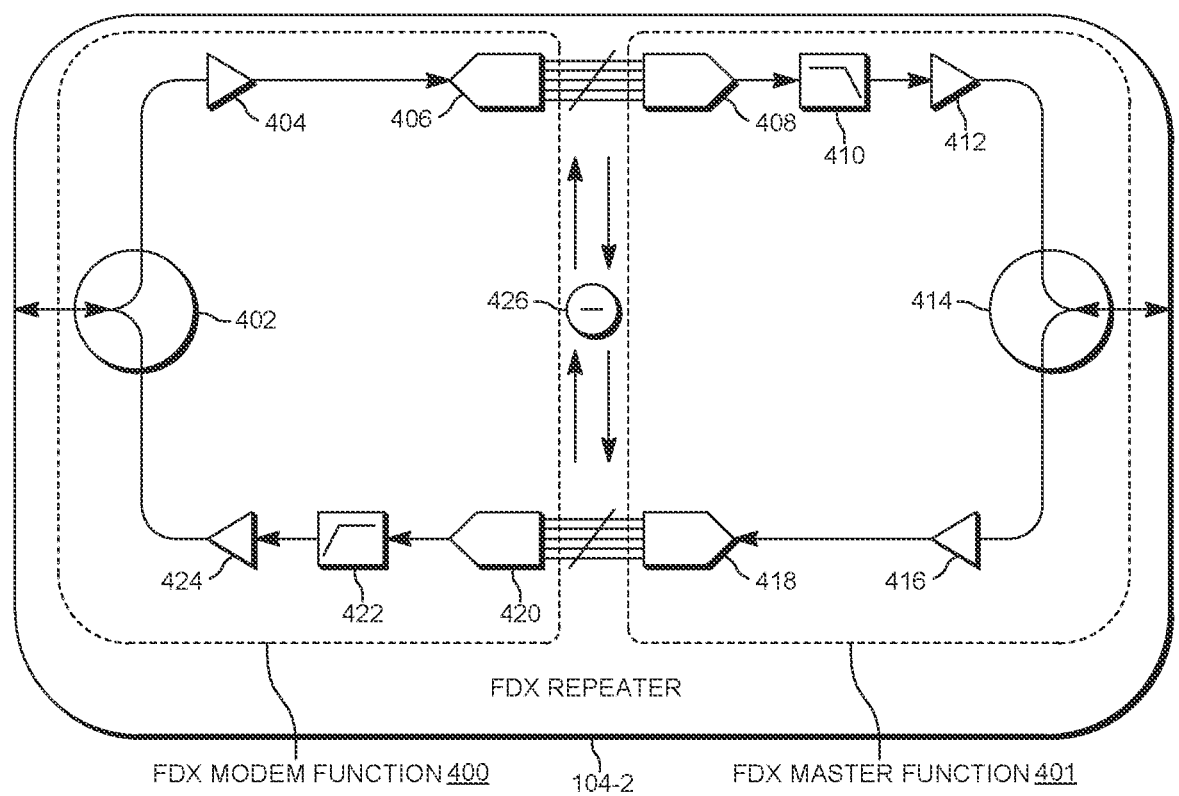
FIG. 4 depicts an example of a FDX repeater according to some embodiments.

FIG. 4 depicts an example of FDX repeater 104-2 according to some embodiments. The upstream and downstream paths include the same functional elements in this example. One difference between FDX repeater 104-2 and FDX regenerator 104-1 is that the digitized signal is not fully deconstructed and reconstructed in FDX repeater 104-2. Rather, the digitized signal includes digital code words of the entire spectrum, not individual code words as described with respect to FDX regenerator 104-1. The digitized signal may be included in a raw spectrum in a digital format and represents the power of the entire spectrum.

Similar to FDX regenerator 104-1, FDX repeater 104-2 includes a network side interface and a subscriber side interface shown as a FDX modem function 400 and a FDX master function 401, respectively. FDX repeater 104-2 also includes a downstream path and an upstream path. In the downstream direction, a directional coupler 402 receives the downstream signal and can couple the downstream signal into the downstream path to an amplifier 404. Amplifier 404 amplifies the signal in the analog domain. It will be understood that amplification does not need to be performed on both sides of the ADC and DAC conversion as described with respect to FDX regenerator 104-1.

After amplification, an analog-to-digital converter 406 converts the analog signal to digital. Then, the digital signal may be sent to a digital-to-analog converter (DAC) 408 to convert the digital signal to analog. As with the FDX regenerator, the analog to digital conversion and the digital to analog conversion is used to isolate the network side interface and the subscriber side interface. That is, the receiver side is isolated from the transmitter side in either the downstream path or the upstream path.

An anti-aliasing filter 410 may then attenuate the higher frequencies to prevent aliasing components from being sampled. An amplifier 412 may then amplify the signal in the analog domain A directional coupler 414 couples the signal in the downstream direction.

In the upstream direction, directional coupler 414 may receive the upstream signal and couple the upstream signal to an amplifier 416, which amplifies the signal in the analog domain. An analog-to-digital converter 418 then converts the analog signal to digital. A digital-to-analog converter 420 converts the digital signal to analog. An anti-aliasing filter 422 receives the signal and attenuates the higher frequencies. An amplifier 424 can then amplify the signal in the analog domain Directional coupler 402 couples the upstream signal in the upstream direction.

FDX repeater 104-2 may also isolate the downstream path and the upstream path by canceling crosstalk. For example, crosstalk cancellation logic 426 may isolate the upstream path and the downstream path by canceling crosstalk. Crosstalk cancellation logic 426 may cancel the crosstalk in the digitized signal between analog-to-digital converter 406 and digital-to-analog 408 and between analog-to-digital converter 418 and digital-to-analog converter 420. Crosstalk logic 426 may perform the crosstalk cancellation on both the downstream path and the upstream path. Crosstalk cancellation logic 426 may be similar to crosstalk cancellation logic 328 of FDX regenerator 104-1. The cancellation approach is similar between Crosstalk cancellation logic 426 may be similar to crosstalk cancellation logic 328, but does not have to be identical. In some embodiments, FDX regenerator 104-1 has the superset of options for how cancellation can be implemented. FDX repeater 104-2 may have a subset of these options. In some embodiments, any form of cancellation that provides adequate crosstalk suppression may be used.

In both FDX repeater 104-2 and FDX regenerator 104-1, cancellation can be performed in the analog domain, the digital domain, or partially in the analog domain in order to reduce the magnitude of the crosstalk relative to the message signal and then further cancelation is performed in the digital domain.

FDX Switched Amplifier 104-3

Figure 5A:
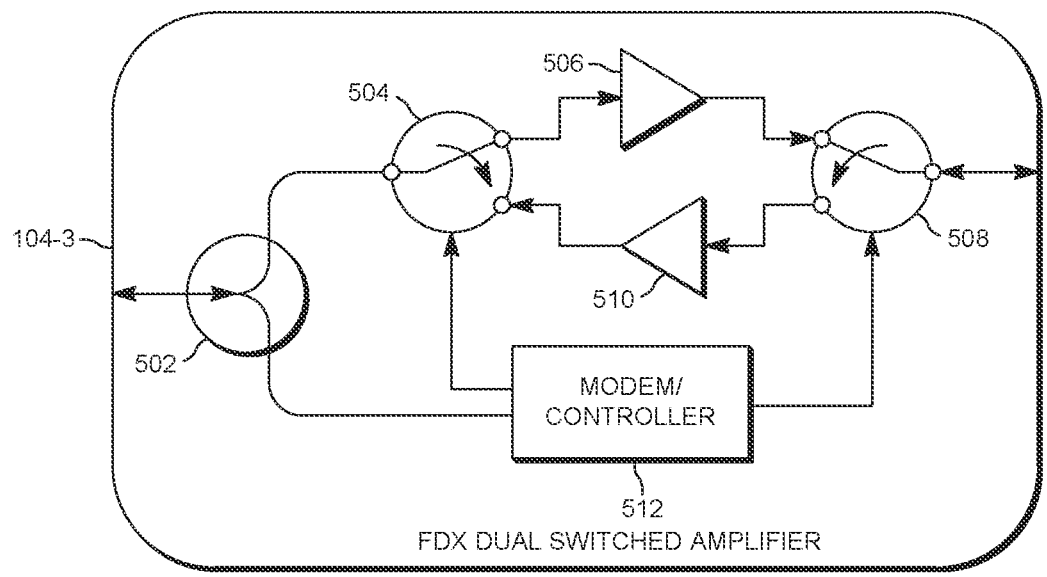
FIG. 5A depicts an example of a FDX dual switched amplifier according to some embodiments.
Figure 5B:
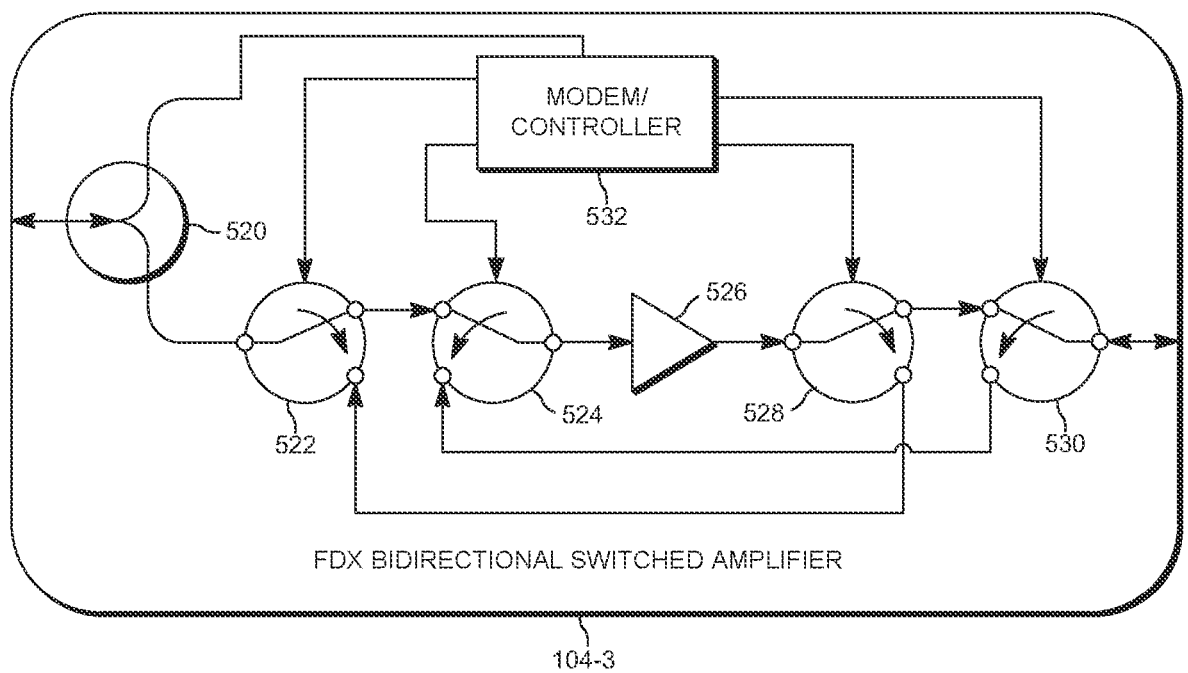
FIG. 5B depicts an example of a FDX bi-directional switched amplifier according to some embodiments.

FIGS. 5A and 5B depict different examples of FDX switched amplifiers 104-3 according to some embodiments. FIG. 5A includes separate upstream and downstream amplifiers and FIG. 5B includes a single amplifier that is switched between two directions. FDX dual switched amplifier 104-3 may operate in a time division duplex (TDD) mode. In this example, the upstream signal and the downstream signal are not processed at the same time. Accordingly, FDX dual switched amplifier 104-3 may be placed towards the end of a network and coupled to subscribers 110 that send or receive signals that interfere with one another. In this example, subscribers 110 cannot transmit or receive at the same time and thus the TDD mode of FDX dual switched amplifier 104-3 is acceptable because the upstream and downstream signals are being sent using TDD.

FIG. 5A depicts an example of a FDX dual switched amplifier 104-3 according to some embodiments. A modem/controller 512 may control switches 504 and 508 to couple the upstream signal to the upstream path and the downstream signal to the downstream path. For example, modem/controller 512 controls switches 504 and 508 based on whether subscribers 110 coupled to FDX dual switched amplifier 104-3 are in a transmit mode or a receive mode. Modem/controller 512 receives the downstream signal and determines that the subscriber is in receive mode. When not receiving the downstream signal, modem/controller 512 determines that the subscriber is in transmit mode. When a subscriber 110 is set to receive a downstream signal in a time slot, modem/controller 512 controls switches 504 and 508 to couple the downstream signal to amplifier 506. Similarly, when a time slot occurs when a subscriber 110 is transmitting an upstream signal, modem/controller 512 controls switches 504 and 508 to couple the upstream signal to amplifier 510.

In the downstream direction, FDX dual switched amplifier 104-3 may receive a downstream signal at a directional coupler 502. Directional coupler 502 can then send the downstream signal to a switch 504, such as a radio frequency (RF) switch. Modem/controller 512 controls switch 504 to couple the downstream signal to a downstream amplifier 506, which may then amplify the signal in the analog domain. The downstream signal is then sent to a switch 508. Modem/controller 512 controls switch 508 to connect to the downstream path and couples the downstream signal in the downstream direction towards subscriber 110.

In the upstream direction, modem/controller 512 controls switch 508 to couple the upstream signal to an amplifier 510. Amplifier 510 then amplifies the signal in the analog domain Modem/controller 512 controls switch 508 to then couple the upstream signal to directional coupler 502. Directional couple 502 then sends the upstream signal in the upstream direction towards FDX node 102.

In the above configuration, two different amplifiers and paths are used to amplify the downstream signals and the upstream signals, respectively. This uses multiple amplifiers, but only two switches, which may simplify the switching logic. The upstream and downstream paths are isolated by TDD in this example and do not use crosstalk cancelation or an analog to digital/digital to analog conversion.

FIG. 5B depicts an example of a FDX bi-directional switched amplifier 104-3 according to some embodiments. In this embodiment, a single amplifier is used and switches are controlled to couple the upstream and downstream signals through different paths to the same amplifier 526. Parts of the downstream and the upstream paths may go through similar components, such as switches and amplifier 526. However, the overall path that is taken is different between the downstream path and the upstream path. That is, the downstream path is coupled through a different sequence of switches compared to the upstream path.

Modem/controller 532 controls switches 522, 524, 528, and 530 in different time slots in which subscribers 110 are in either transmit mode or receive mode. In one example, modem/controller 532 receives the downstream signal may use the downstream signal to determine when subscribers 110 are in transmit mode or receive mode. For example, when a downstream signal is received, modem/controller 532 receives a signal from directional coupler 520 and determines that this time slot is for subscribers 110 that are in receive mode. Then, modem/controller 532 controls switches 522, 524, 528, and 530 to couple the signal to the downstream path. When the downstream signal is not received, modem/controller 532 controls switches 522, 524, 528, and 530 to couple the signal to the upstream path.

In the downstream direction, a directional coupler 520 may couple the downstream signal to a switch 522. Modem/controller 532 controls switch 522 to couple the signal to switch 524. Then, modem/controller 532 controls switch 524 to couple the signal to amplifier 526. Amplifier 526 can then amplify the signal in the analog domain and couple the signal to switch 528. Modem/controller 532 controls switch 528 to couple the signal to a switch 530, which then sends the signal downstream.

In the upstream direction, modem/controller 532 controls switch 530 to couple the signal to switch 524. From switch 524, modem/controller 532 controls switch 524 to couple the upstream signal to amplifier 526 for amplification. Then, modem/controller 532 controls switch 528 and switch 522 to send the upstream signal to directional coupler 520.

Method Flows

Figure 6:
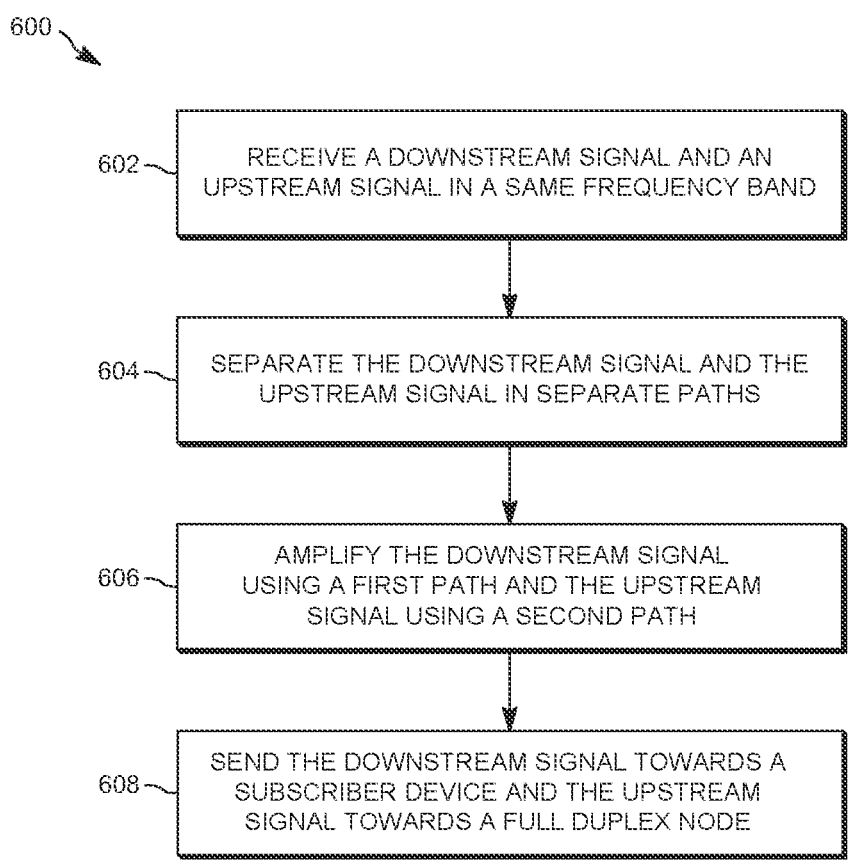
FIG. 6 depicts a simplified flowchart of a method for processing full duplex signals according to some embodiments.

FIG. 6 depicts a simplified flowchart 600 of a method for processing full duplex signals according to some embodiments. At 602, FDX expander 104 receives a downstream signal and an upstream signal in a same frequency band. As discussed above, in some embodiments, the downstream signal and the upstream signal may be received at the same time. In other embodiments, the downstream signal and the upstream signal may be received at different times.

At 604, FDX expander 104 separates the downstream signal and the upstream signal into separate paths. As described above, different types of FDX expanders 104 may separate the downstream signal and the upstream signal differently.

At 606, FDX expander 104 amplifies the downstream signal using a first path and amplifies the upstream signal using a second path. In some examples, different amplifiers may be used to amplify the downstream signal and the upstream signal. However, a same amplifier may be used to amplify the downstream signal and the upstream signal, but different paths may be used to couple the downstream signal and the upstream signal to the amplifier.

At 608, FDX expander 104 sends the downstream signal to a subscriber device and sends the upstream signal to a FDX node 102. It will be understood that sending a downstream signal toward a subscriber device may send the signal through other FDX expanders 104, taps 112, or other network devices. Additionally, sending the upstream signal toward FDX node 102 may send the upstream signal to other FDX expanders 104.

Accordingly, FDX expanders 104 provide amplification in a full duplex network without having to convert each amplifier to a FDX node 102. This allows the network to use amplification without converting the network to an N+0 network. FDX expanders 104 isolate the upstream and downstream signals using different techniques. For example, crosstalk cancellation logic may be used and/or a TDD mode.

System

FIG. 7 illustrates an example of a special purpose computer systems 700 configured with a FDX expander 104 according to one embodiment. Computer system 700 includes a bus 702, network interface 704, a computer processor 706, a memory 708, a storage device 710, and a display 712.

Bus 702 may be a communication mechanism for communicating information. Computer processor 706 may execute computer programs stored in memory 708 or storage device 708. Any suitable programming language can be used to implement the routines of some embodiments including C, C++, Java, assembly language, etc. Different programming techniques can be employed such as procedural or object oriented. The routines can execute on a single computer system 700 or multiple computer systems 700. Further, multiple computer processors 706 may be used.

Memory 708 may store instructions, such as source code or binary code, for performing the techniques described above. Memory 708 may also be used for storing variables or other intermediate information during execution of instructions to be executed by processor 706. Examples of memory 708 include random access memory (RAM), read only memory (ROM), or both.

Storage device 710 may also store instructions, such as source code or binary code, for performing the techniques described above. Storage device 710 may additionally store data used and manipulated by computer processor 706. For example, storage device 710 may be a database that is accessed by computer system 700. Other examples of storage device 710 include random access memory (RAM), read only memory (ROM), a hard drive, a magnetic disk, an optical disk, a CD-ROM, a DVD, a flash memory, a USB memory card, or any other medium from which a computer can read.

Memory 708 or storage device 710 may be an example of a non-transitory computer-readable storage medium for use by or in connection with computer system 700. The non-transitory computer-readable storage medium contains instructions for controlling a computer system 700 to be configured to perform functions described by some embodiments. The instructions, when executed by one or more computer processors 706, may be configured to perform that which is described in some embodiments.

Computer system 700 includes a display 712 for displaying information to a computer user. Display 712 may display a user interface used by a user to interact with computer system 700.

Computer system 700 also includes a network interface 704 to provide data communication connection over a network, such as a local area network (LAN) or wide area network (WAN). Wireless networks may also be used. In any such implementation, network interface 704 sends and receives electrical, electromagnetic, or optical signals that carry digital data streams representing various types of information.

Computer system 700 can send and receive information through network interface 704 across a network 714, which may be an Intranet or the Internet. Computer system 700 may interact with other computer systems 700 through network 714. In some examples, client-server communications occur through network 714. Also, implementations of some embodiments may be distributed across computer systems 700 through network 714.

Some embodiments may be implemented in a non-transitory computer-readable storage medium for use by or in connection with the instruction execution system, apparatus, system, or machine. The computer-readable storage medium contains instructions for controlling a computer system to perform a method described by some embodiments. The computer system may include one or more computing devices. The instructions, when executed by one or more computer processors, may be configured to perform that which is described in some embodiments.

As used in the description herein and throughout the claims that follow, "a", "an", and "the" includes plural references unless the context clearly dictates otherwise. Also, as used in the description herein and throughout the claims that follow, the meaning of "in" includes "in" and "on" unless the context clearly dictates otherwise.

The above description illustrates various embodiments along with examples of how aspects of some embodiments may be implemented. The above examples and embodiments should not be deemed to be the only embodiments, and are presented to illustrate the flexibility and advantages of some embodiments as defined by the following claims. Based on the above disclosure and the following claims, other arrangements, embodiments, implementations and equivalents may be employed without departing from the scope hereof as defined by the claims.

What is claimed is:

1. A method for simultaneous transmission of upstream and downstream signals in a same frequency band, the method comprising:
   receiving at a position following a Full Duplex (FDX) node in the downstream direction, a downstream analog signal from the FDX node and an upstream analog signal in the same frequency band;
   separating and separately amplifying the downstream analog signal and the upstream analog signal;
   reducing crosstalk between the upstream and downstream signals so as to isolate the separated downstream analog signal and the separated upstream analog signal from one another;
   sending, the amplified downstream analog signal downstream; and
   sending the amplified upstream analog signal towards a full duplex node.

2. The method of claim 1, wherein the downstream signal and the upstream signal are received during a same time slot.

3. The method of claim 2, wherein a subscriber device in a receive mode receives the amplified downstream signal, and another subscriber device that sent the upstream signal is in a transmit mode in the same time slot.

4. The method of claim 3, wherein the subscriber device is in a receive mode in a first time slot and another subscriber device that sent the upstream signal is in a transmit mode in a second time slot different from the first time slot.

5. The method of claim 1, wherein the downstream signal and the upstream signal are received in different time slots.

6. The method of claim 1, where reducing crosstalk between the downstream signal and the upstream signal is performed in a computing device at a position following the FDX node in the downstream direction.

7. The method of claim 1, wherein isolation of the downstream signal and the upstream signal comprises:
   converting the downstream signal or the upstream signal from analog to digital; and
   converting the downstream signal or the upstream signal from digital to analog.

8. The method of claim 7, wherein amplifying the downstream signal or the upstream signal comprises performing one or more of amplifying the downstream signal or the upstream signal before converting the downstream signal or the upstream signal from analog to digital and amplifying the downstream signal or the upstream signal after converting the downstream signal or the upstream signal from digital to analog.

9. The method of claim 7, wherein converting the downstream signal or the upstream signal from analog to digital and from digital to analog isolates a receiver side that receives the downstream signal or the upstream signal and a transmitter side that transmits the downstream signal or the upstream signal.

10. The method of claim 7, further comprising:
    decoding the downstream signal or the upstream signal after converting the downstream signal or the upstream signal from analog to digital; and
    reconstructing the downstream signal or the upstream signal after decoding.

11. The method of claim 7, wherein isolation of the downstream signal and the upstream signal comprises reducing crosstalk from either the downstream signal and the upstream signal after converting the downstream signal or the upstream signal from analog to digital.

12. The method of claim 7, wherein isolation of the downstream signal and the upstream signal comprises reducing crosstalk from either the downstream signal and the upstream signal before converting the downstream signal or the upstream signal from analog to digital.

13. The method of claim 1, wherein amplifying the downstream signal using the first path and the upstream signal using the second path comprises:
    coupling the downstream signal to a first amplifier to amplify the downstream signal during a first time slot; and
    coupling the upstream signal to a second amplifier to amplify the upstream signal during a second time slot.

14. The method of claim 1, wherein amplifying the downstream signal using the first path and the upstream signal using the second path comprises:
    coupling the downstream signal to an amplifier to amplify the downstream signal during a first time slot; and
    coupling the upstream signal to the amplifier to amplify the upstream signal during a second time slot.

* * * * *